US009051423B2

(12) United States Patent
Qiu

(10) Patent No.: US 9,051,423 B2
(45) Date of Patent: *Jun. 9, 2015

(54) FLUORINATED COATING AND PHOTOTOOLS MADE THEREWITH

(75) Inventor: Zai-Ming Qiu, Woodbury, MN (US)

(73) Assignee: 3M Innovative Properties Company, St. Paul, MN (US)

(*) Notice: Subject to any disclaimer, the term of this patent is extended or adjusted under 35 U.S.C. 154(b) by 477 days.

This patent is subject to a terminal disclaimer.

(21) Appl. No.: 13/389,041

(22) PCT Filed: Sep. 14, 2010

(86) PCT No.: PCT/US2010/048751
§ 371 (c)(1),
(2), (4) Date: Feb. 6, 2012

(87) PCT Pub. No.: WO2011/034845
PCT Pub. Date: Mar. 24, 2011

(65) Prior Publication Data
US 2012/0171433 A1 Jul. 5, 2012

Related U.S. Application Data

(60) Provisional application No. 61/243,022, filed on Sep. 16, 2009.

(51) Int. Cl.
G03F 7/00 (2006.01)
C08F 8/00 (2006.01)
C08G 65/22 (2006.01)
G03F 1/00 (2012.01)
C08F 220/22 (2006.01)
C08F 220/32 (2006.01)
C08F 230/08 (2006.01)
C08G 65/00 (2006.01)
C08G 65/336 (2006.01)
G03F 7/004 (2006.01)
G03F 7/038 (2006.01)
G03F 7/075 (2006.01)

(52) U.S. Cl.
CPC ......... C08G 65/22 (2013.01); Y10T 428/24802 (2015.01); G03F 1/144 (2013.01); C08F 220/22 (2013.01); C08F 220/32 (2013.01); C08F 230/08 (2013.01); C08G 65/007 (2013.01); C08G 65/336 (2013.01); G03F 7/0046 (2013.01); G03F 7/038 (2013.01); G03F 7/0751 (2013.01); G03F 7/0758 (2013.01)

(58) Field of Classification Search
USPC ............. 430/5, 311, 322, 280.1; 522/14, 129, 522/103
See application file for complete search history.

(56) References Cited

U.S. PATENT DOCUMENTS

| 3,131,161 | A | 4/1964 | Nitzsche |
| 3,250,808 | A | 5/1966 | Moore, Jr. |
| 3,753,755 | A | 8/1973 | Olson |
| 3,875,045 | A | 4/1975 | Bergrahm |
| 4,000,115 | A | 12/1976 | Jacobs |
| 4,025,348 | A | 5/1977 | Tsukada |
| 4,025,407 | A | 5/1977 | Chang |
| 4,049,861 | A | 9/1977 | Nozari |
| 4,058,401 | A | 11/1977 | Crivello |
| 4,069,055 | A | 1/1978 | Crivello |
| 4,094,911 | A | 6/1978 | Mitsch |
| 4,100,134 | A | 7/1978 | Robins |
| 4,101,513 | A | 7/1978 | Fox |
| 4,130,690 | A | 12/1978 | Lien |
| 4,156,035 | A | 5/1979 | Tsao |
| 4,156,046 | A | 5/1979 | Lien |
| 4,161,478 | A | 7/1979 | Crivello |
| 4,267,302 | A | 5/1981 | Ohmori |
| 4,279,717 | A | 7/1981 | Eckberg |
| 4,293,606 | A | 10/1981 | Zollinger |
| 4,333,998 | A | 6/1982 | Leszyk |
| 4,337,107 | A | 6/1982 | Eshleman |
| 4,348,462 | A | 9/1982 | Chung |
| 4,353,980 | A | 10/1982 | Helling |
| 4,399,192 | A | 8/1983 | Russell |
| 4,426,431 | A | 1/1984 | Harasta |
| 4,504,401 | A | 3/1985 | Matsuo |

(Continued)

FOREIGN PATENT DOCUMENTS

| DE | 10004132 | 8/2001 |
| EP | 212319 | 3/1987 |

(Continued)

OTHER PUBLICATIONS

Bongiovanni, "Use of Fluorinated Compounds in Cationic UV-curing," Photochemistry and UV Curing: New Trends, 2006, pp. 279-292.

Bongiovanni, "Fluorinated Additives in Cationic Photopolymerization," RadTech Europe, [online], [retrived from the internet on Oct. 6, 2011], website no longer available, www.radtech-europe.com/filescontent/september%202004%20papers/bongiovannipaperseptember2004.pdf, pp. 7.

Coggio, "New Durable, Soil Resistant Optical Film for Front Surface Protection of Flat-Panel Displays", Digest of Technical Papers, Society for Information Display International Symposium, 2005, vol. 36, pp. 175-177.

"Epoxide", source unknown, date unknown but believed to be prior to the date of the filing of the present application, 4 pages.

"Epoxy Resins", source unknown, date unknown but believed to be prior to the date of the filing of the present application, 4 pages.

(Continued)

Primary Examiner — Amanda C Walke

(57) ABSTRACT

A coating is disclosed, comprising the reaction product of: an epoxy silane; and an oligomer comprising $M^F M^E M^S$ wherein $M^F$ comprises a fluorinated (meth)acrylate, $M^E$ comprises an epoxy(meth)acrylate, and $M^S$ comprises a silane(meth)acrylate. Phototools comprising a layer of the coating on a substrate can be made. A method of making a printed assembly such as a printed circuit board is also disclosed.

19 Claims, No Drawings

(56) References Cited

U.S. PATENT DOCUMENTS

| | | |
|---|---|---|
| 4,508,916 A | 4/1985 | Newell |
| 4,623,676 A | 11/1986 | Kistner |
| 4,647,413 A | 3/1987 | Savu |
| 4,818,801 A | 4/1989 | Rice |
| 4,830,910 A | 5/1989 | Larson |
| 4,959,426 A | 9/1990 | Re |
| 5,021,501 A | 6/1991 | Ohmori |
| 5,073,404 A | 12/1991 | Huang |
| 5,242,972 A * | 9/1993 | Negishi et al. ............... 524/545 |
| 5,274,159 A | 12/1993 | Pellerite |
| 5,340,898 A | 8/1994 | Cavezzan |
| 5,514,728 A | 5/1996 | Lamanna |
| 5,554,664 A | 9/1996 | Lamanna |
| 5,576,095 A | 11/1996 | Ueda |
| 5,723,860 A | 3/1998 | Hamada |
| 5,980,992 A * | 11/1999 | Kistner et al. ............... 427/384 |
| 6,187,834 B1 | 2/2001 | Thayer |
| 6,190,743 B1 | 2/2001 | Wang |
| 6,204,350 B1 | 3/2001 | Liu |
| 6,344,526 B1 | 2/2002 | Noguchi |
| 6,361,870 B1 | 3/2002 | Steffl |
| 6,448,346 B1 | 9/2002 | Noguchi |
| 6,646,088 B2 | 11/2003 | Fan |
| 6,678,495 B1 | 1/2004 | Badesha |
| 6,753,380 B2 | 6/2004 | Qiu |
| 6,767,946 B2 | 7/2004 | Shimada |
| 6,803,109 B2 | 10/2004 | Qiu |
| 6,811,931 B1 | 11/2004 | Fujioka |
| 7,037,585 B2 | 5/2006 | Treadway |
| 7,097,910 B2 | 8/2006 | Moore |
| 7,166,329 B2 * | 1/2007 | Dams ............................ 427/344 |
| 7,189,479 B2 | 3/2007 | Lu |
| 7,335,786 B1 | 2/2008 | Iyer |
| 7,495,118 B2 | 2/2009 | Dams |
| 7,718,264 B2 | 5/2010 | Klun |
| 7,728,098 B2 | 6/2010 | Dams |
| 7,745,653 B2 | 6/2010 | Iyer |
| 7,825,272 B2 | 11/2010 | Iyer |
| 7,897,678 B2 | 3/2011 | Qiu |
| 8,002,886 B2 | 8/2011 | Clark |
| 8,015,970 B2 | 9/2011 | Klun |
| 8,663,874 B2 * | 3/2014 | Qiu et al. ...................... 430/5 |
| 8,748,060 B2 * | 6/2014 | Qiu .................................. 430/5 |
| 2003/0207963 A1 | 11/2003 | Zang |
| 2004/0014718 A1 | 1/2004 | Pai |
| 2004/0077775 A1 | 4/2004 | Audenaert |
| 2004/0092675 A1 | 5/2004 | Moore |
| 2004/0147188 A1 | 7/2004 | Johnson |
| 2005/0037932 A1 | 2/2005 | Liu |
| 2005/0042553 A1 | 2/2005 | Lu |
| 2005/0054804 A1 | 3/2005 | Dams |
| 2005/0121644 A1 | 6/2005 | Dams |
| 2005/0164010 A1 | 7/2005 | Trombetta |
| 2005/0196626 A1 | 9/2005 | Knox |
| 2005/0196696 A1 | 9/2005 | King |
| 2005/0233103 A1 | 10/2005 | Enomoto |
| 2006/0147177 A1 | 7/2006 | Jing |
| 2006/0148350 A1 | 7/2006 | Chang |
| 2006/0153993 A1 | 7/2006 | Schmidt |
| 2006/0154091 A1 | 7/2006 | Schmidt |
| 2006/0165919 A1 | 7/2006 | Suzuki |
| 2006/0216524 A1 | 9/2006 | Klun |
| 2006/0228560 A1 | 10/2006 | Stewart |
| 2007/0014927 A1 | 1/2007 | Buckanin |
| 2007/0128557 A1 | 6/2007 | Lu |
| 2007/0275171 A1 | 11/2007 | Dang |
| 2007/0287093 A1 | 12/2007 | Jing |
| 2008/0041272 A1 | 2/2008 | Tomasino |
| 2008/0075947 A1 | 3/2008 | Padiyath |
| 2008/0124555 A1 | 5/2008 | Klun |
| 2009/0025608 A1 | 1/2009 | Qiu |
| 2009/0025727 A1 | 1/2009 | Klun |
| 2009/0148711 A1 | 6/2009 | LeBlanc |
| 2010/0092686 A1 | 4/2010 | Laryea |
| 2010/0160595 A1 | 6/2010 | Klun |
| 2011/0008733 A1 | 1/2011 | Qiu |
| 2011/0020657 A1 | 1/2011 | Chang |
| 2011/0027702 A1 | 2/2011 | Qiu |
| 2011/0065045 A1 | 3/2011 | Qiu |

FOREIGN PATENT DOCUMENTS

| | | |
|---|---|---|
| EP | 271872 | 6/1988 |
| EP | 572179 | 12/1993 |
| EP | 1083205 | 3/2001 |
| EP | 1225187 | 7/2002 |
| EP | 1225188 | 7/2002 |
| EP | 1411073 | 4/2004 |
| FR | 2886309 | 12/2006 |
| JP | 2232251 | 9/1990 |
| JP | 10176139 | 6/1998 |
| JP | 2004/250517 A | 9/2004 |
| JP | 2004250517 | 9/2004 |
| JP | 2005046767 | 2/2005 |
| JP | 2006169328 | 6/2006 |
| KR | 10-2006-00080182 | 7/2006 |
| WO | WO 03/055954 | 7/2003 |
| WO | WO 03/072625 | 9/2003 |
| WO | WO 2004/024790 | 3/2004 |
| WO | WO 2004/056495 | 7/2004 |
| WO | WO 2005/014742 | 2/2005 |
| WO | WO 2005/023822 | 3/2005 |
| WO | WO 2006/030721 | 3/2006 |
| WO | WO 2006/073867 A1 | 7/2006 |
| WO | WO 2006/074033 | 7/2006 |
| WO | WO 2008/131715 | 11/2008 |
| WO | WO 2009/035874 | 3/2009 |
| WO | WO 2009/069974 | 6/2009 |
| WO | WO 2009/083564 | 7/2009 |
| WO | WO 2009/086515 | 7/2009 |
| WO | WO 2009/114572 | 9/2009 |
| WO | WO 2009/114580 | 9/2009 |
| WO | WO 2009114572 A2 * | 9/2009 |
| WO | WO 2009114580 A2 * | 9/2009 |
| WO | WO 2011/011167 | 1/2011 |
| WO | WO 2011/034847 | 3/2011 |
| WO | WO 2011/034885 | 3/2011 |

OTHER PUBLICATIONS

"Mask Process", PKL, 1997, Choognam, Korea, [online], [retrieved from the internet on Feb. 25, 2008], URL <www.pkl.co.kr/english/product/product05.html>, 3 pages.

Physical Review E, Statistical Physics, Plasmas, Fluids, and Related Interdisciplinary Topics, Feb. 1999, Part A, Third Series, vol. 59, No. 2, 5 pages.

Sangermano, "Fluorinated Alcohols as Surface-Active Agents in Cationic Photopolymerization of Epoxy Monomers", Journal of Polymer Science: Part A: Polymer Chemistry, Feb. 2006, vol. 43, pp. 4144-4150.

Sangermano, "Fluorinated Hyperbranched Polymers as Additives in Cationic Photopolymerization", Macromolecular Materials and Engineering, 2004, vol. 289, No. 8, pp. 722-727.

Sangermano, "Synthesis and Cationic Photopolymerization of a New Fluorinated Oxetane Monomer", Polymer, 2004, vol. 45, No. 7, pp. 2133-2139.

Sangermano, "Synthesis and Cationic Photopolymerization of New Fluorinated Polyfunctional Propenyl Ether Oligomers", Journal of Polymer Science, Part A: Polymer Chemistry, 2006, vol. 44, pp. 6943-6951.

Yarbrough, "Contact Angle Analysis, Surface Dynamics, and Biofouling Characteristics of Cross-Linkable, Random Perfluoropolyether-Based Graft Terpolymers", Macromolecules, 2006, vol. 39, No. 7, pp. 2521-2528.

International Search Report for PCT/US2010/048751, mailed Dec. 27, 2010, 4 pages.

* cited by examiner

FLUORINATED COATING AND PHOTOTOOLS MADE THEREWITH

CROSS REFERENCE TO RELATED APPLICATIONS

This application is a national stage filing under 35 U.S.C. 371 of PCT/US2010/048751, filed Sep. 14, 2010, which claims priority to Provisional Application No.61/243,022, filed Sep. 16, 2009, the disclosure of which is incorporated by reference in its/their entirety herein.

FIELD

Fluorinated coatings, particularly fluorinated coatings made from fluorinated epoxy silane(meth)acrylate oligomers, are disclosed. Phototools made with the coatings can be made and used to form printed assemblies such as printed circuit boards.

BACKGROUND

In the printed circuit industry, a mask bearing an image in the form of a circuit pattern is known as a phototool. A photosensitive material can be disposed between the phototool and a metal substrate, and radiation applied through the phototool to form the negative of the image in the form of hardened photosensitive material. The phototool is then separated from the hardened and unhardened photosensitive material, and any unhardened photosensitive material removed to leave the hardened negative image on the substrate. It is desirable for a phototool to be durable enough such that it can be used repeatedly with accurate reproduction of a circuit pattern.

SUMMARY

Disclosed herein is an oligomer and coating comprising the oligomer. The oligomer may comprise an oxirane ring, a hydrolysable silane group, and a fluorinated group. The coating comprises the reaction product of an epoxy silane and the oligomer. In some embodiments, the coating comprises: an epoxy silane and an oligomer comprising: $M^F M^E M^S$ NI wherein $M^F$ comprises a fluorinated (meth)acrylate, $M^E$ comprises an epoxy(meth)acrylate, and $M^S$ comprises a silane (meth)acrylate.

Assemblies comprising a phototool, the fluorinated coating and a metal substrate are also disclosed. Phototools having an image of a circuit pattern can be used in conjunction with radiation sensitive materials to make printed circuit boards.

A method of making a printed assembly is also disclosed. The method may comprise: providing a phototool comprising a coating layer disposed on an optically clear substrate that provides an image, providing a photoresist layer on a metal substrate, then laminating together the phototool together such that the photoresist layer is disposed between the phototool and metal substrate, exposing the photoresist layer to radiation through the phototool thereby hardening the photoresist layer in selected areas to form a negative image as designed in the phototool. The phototool can then be easily separated or released from the hardened and unhardened photoresist layer for repeated use. The printed assembly may comprise a printed circuit board.

DETAILED DESCRIPTION

During manufacture of printed circuit assemblies, the surface of a phototool which bears the circuit pattern must be routinely and carefully inspected using a microscope to ensure that there are no scratches on the surface, for example, breaks in the fine lines in the circuit pattern. These inspections can take from 2 to 3 hours depending on the size and intricacy of the circuit pattern. Scratches and other abrasions can occur as the surface of the phototool is often wiped to remove dust, lint, etc. Also, the phototool is typically laminated onto copper sheeting, with photosensitive material in between, and small burrs or rough edges of the copper sheeting can cause scratches and other abrasions on the surface of the phototool.

Due to the fact that phototools are vulnerable to scratching and that abrasion is a serious problem during the normal use of a phototool, protective films and overcoats are often employed to protect the phototool. For example, polyester films coated with various kinds of pressure sensitive adhesives have been laminated to image-bearing surfaces to protect the image. Because of their thickness, however, laminating films can cause optical distortion and hence loss of resolution. Thinner protective coatings can be obtained by coating the surfaces of phototools with liquid compositions. After application, the thin liquid coating is hardened to yield the desired protective coat. Many protective overcoats have limited release properties, however, and can therefore stick to the surface of the photoresist, particularly when relatively sticky materials such as high viscosity solder mask inks are present. Although film with silicone layer applied by lamination on phototool can provide good release properties, it is soft and almost no resitant to scratch with limited protection in addition to thickness issue.

In view of the foregoing, there is a need for coating compositions or coatings that can be used to protect surfaces and objects from scratching and abrasion, and for phototool applications, it would be advantageous if coatings easily release from relatively sticky materials such as solder mask inks.

The coatings disclosed herein can provide abrasion resistance, hardness, clarity, low surface energy with low adhesion, release properties, anti-reflection, resistance to staining and soiling, and repellency to stains, soils, solvents, oil, and water. When coated on a substrate, the coating is relatively durable, more resistant to contamination and easier to clean than the bare substrate surface itself. Any substrate may be employed including hard substrates such as natural stone, man-made stone, ceramic, vinyl, wood, masonry, cork, glass, or the like. Polymeric substrates such as poly(ethylene terephthalate), polycarbonate and polymethylmethacryate may also be employed.

The coatings may be used for protecting phototools from scratching and abrasion. The coatings can have good release properties and not stick to photoresist surfaces even when sticky materials such as solder masks are present. Phototools with the coatings disclosed herein can be used repeatedly to make many contact prints, for example, the phototools can be used at least 5, 10 or 20 times.

The coatings can have low surface energy with receding water contact angles greater than about 70° (preferably, greater than about 80°; more preferably, greater than about 90°) and receding hexadecane contact angles greater than about 50° (preferably, greater than about 55°, more preferably, greater than about 60°). The coatings can have good release properties as evidenced by low peel force.

The coating may comprise the reaction product of: an epoxy silane; and an oligomer comprising:

$$M^F M^E M^S$$

wherein
$M^F$ comprises a fluorinated (meth)acrylate,
$M^E$ comprises an epoxy(meth)acrylate, and
$M^S$ comprises a silane(meth)acrylate.

The epoxy silane is generally curable as described below, for example, using a photo-acid generator. The epoxy silane comprises at least one polymerizable epoxy group and at least one polymerizable silane group. Either one or both of these polymerizable groups may be terminal groups. The epoxy silane may be monomeric, oligomeric, or polymeric. The epoxy silane may be represented by the formula:

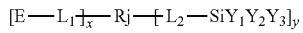
$[E-L_1]_x-Rj-[L_2-SiY_1Y_2Y_3]_y$ wherein: E is an organic group having at least one oxirane ring; $L_1$ and $L_2$ are independently divalent linking groups; Rj is multivalent monomeric, oligomeric, or polymeric residue; $Y_1$, $Y_2$ and $Y_3$ are independently alkyl groups, aryl groups or hydrolyzable groups, wherein at least one of $Y_1$, $Y_2$ and $Y_3$ is a hydrolyzable group; x is at least 1; and y is at least 1. E may comprise an organic group having a glycidoxy or epoxycyclohexyl group. Hydrolyzable groups include alkoxy groups having $C_1$-$C_4$ alkyl groups. In general, for structural formulae appearing within this description, substitution of divalent linking groups is implied unless specifically excluded.

$L_1$ and $L_2$ may comprise independently non-hydrolyzable linear or branched, cyclic or acyclic aliphatic, aromatic, or aliphatic and aromatic divalent hydrocarbon linking groups. The divalent linking groups may have less than 20 carbon atoms or less than 10 carbon atoms, for example, the divalent linking groups may comprise independently methylene, ethylene, isopropylene, butylene, decalene, phenylene, cyclohexylene, cyclopentylene, methylcyclohexylene, 2-ethylbutylene, vinyl or allene. $L_1$ and $L_2$ may comprise independently $-C_6H_4-CH_2CH_2-$ or $-CH_2C(CH_3)_2CH_2-$. $L_1$ and $L_2$ may comprise independently an acyl group such as formyl, acetyl, and propionyl.

$L_1$ and $L_2$ may comprise independently one or more heteroatoms such as N, O, and S as long as the curability or performance of the coating is not affected detrimentally. Suitable divalent linking groups may comprise ether, ester, amide, $NO_2$, alkyloxy, thioether, sulfone, and halogen functionality. $L_1$ and $L_2$ may comprise independently ethylene oxide functionality as represented by $-(CH_2CH_2O)_kZ-$ wherein k is an integer of from 1 to 10 and Z is an alkylene group of less than 10 carbon atoms. $L_1$ and $L_2$ may comprise independently $-CH_2CH_2-$, $-CH_2CH_2OCH_2CH_2-$, $-(CH_2CH_2)_2OCH_2CH_2-$, $-CH_2OCH_2CH_2-$ or $-CH_2OCH_2CH_2CH_2-$.

Useful epoxy silanes may be represented by the formula:

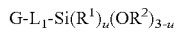
$G-L_1-Si(R^1)_u(OR^2)_{3-u}$ wherein: G is a glycidoxy or epoxycyclohexyl group; $L_1$ is a divalent linkage as described above; $R^1$ and $R^2$ are independently $C_1$-$C_4$ alkyl groups; and u is 0 or 1. Exemplary epoxy silanes include glycidoxymethyl trialkoxysilanes; glycidoxyethyl trialkoxysilanes; glycidoxypropyl trialkoxysilanes; glycidoxybutyl trialkoxysilanes; (3,4-epoxycyclohexyl)methyl trialkoxysilanes; (3,4-epoxycyclohexyl)ethyl trialkoxysilanes; (3,4-epoxycyclohexyl)propyl trialkoxysilanes; and (3,4-epoxycyclohexyl)butyl trialkoxysilanes. Particular epoxy silanes are described in International Application No. PCT/US2009/036733 to Qiu et al.

The epoxy silane may comprise:

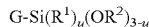
$G-Si(R^1)_u(OR^2)_{3-u}$ wherein G, $R^2$ and $R^3$ are described in the previous paragraph.

The epoxy silane may comprise:

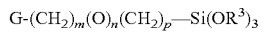
$G-(CH_2)_m(O)_n(CH_2)_p-Si(OR^3)_3$ wherein: G is a glycidoxy or epoxycyclohexyl group; m is 1 to 6; n is 0 or 1; p is 1 to 6; $R^3$ is H or $C_1$-$C_{10}$ alkyl group.

Partially hydrolyzed derivatives of any of the epoxy silanes disclosed herein may be useful; these partially hydrolyzed derivatives comprise silanes in which alkoxy groups bonded to silicon are replaced by hydroxyl groups. Partially condensated derivatives of any of the epoxy silanes disclosed herein may be useful; these partially condensated derivatives comprise silanes in which alkoxy groups bonded to silicon are replaced by siloxy groups. For example, partially hydrolyzed and partially condensated derivatives may comprise:

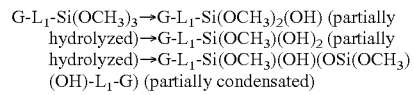
G-L$_1$-Si(OCH$_3$)$_3$→G-L$_1$-Si(OCH$_3$)$_2$(OH) (partially
 hydrolyzed)→G-L$_1$-Si(OCH$_3$)(OH)$_2$ (partially
 hydrolyzed)→G-L$_1$-Si(OCH$_3$)(OH)(OSi(OCH$_3$)
 (OH)-L$_1$-G) (partially condensed)

Partially hydrolyzed and/or partially condensed derivatives may be used alone or in combination with each other, and/or with any of the epoxy silanes disclosed herein. Prepolymers are formed by the polymerization of groups other than the silanes as in U.S. Pat. No. 4,100,134 (Robins et al.) and U.S. Pat. No. 7,037,585 (Treadway).

The epoxy silane may be selected from the group consisting of: gamma-glycidoxypropyl trimethoxysilane and beta-(3,4-epoxycyclohexyl)ethyl trimethoxysilane.

The epoxy silane may be used in any amount desired depending on the desired properties of the coating. For example, the epoxy silane may comprise from about 50 to about 90 wt. % or from about 70 to about 90 wt. %, relative to the total weight of the coating. The epoxy silane may also comprise from about 70 to about 98 wt. %, or from about 90 to about 98 wt. %, relative to the total weight of the coating. The epoxy silane may also comprise from about 50 to about 95 wt. %, relative to the total weight of the coating.

The oligomer comprises the reaction product of:

$M^F M^E M^S$ wherein
$M^F$ comprises a fluorinated (meth)acrylate,
$M^E$ comprises an epoxy(meth)acrylate, and
$M^S$ comprises a silage (meth)acrylate. Alternatively, the oligomer comprises the reaction product of: a perfinoropolyether (meth)acrylate, an epoxy (meth)acrylate, and a silane (meth)acrylate.

The fluorinated (meth)acrylate may be represented by the formula:

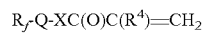
$R_f\text{-}Q\text{-}XC(O)C(R^4)\!=\!CH_2$ wherein: $R_f$ comprises a monovalent fluorinated group; Q comprises a divalent linking group; X comprises O, S, NH or $NR^5$ wherein $R^5$ is a $C_1$-$C_4$ alkyl group; and $R^4$ comprises H or $CH_3$.

The perfluoropolyether group $R_f$ can be linear, branched, cyclic, or combinations thereof and can be saturated or unsaturated. The perfluoropolyether group $R_f$ has at least two catenated oxygen atoms. Exemplary perfluoropolyethers include those having perfluorinated repeating units selected from the group consisting of $-(C_qF_{2q})-$, $-(C_qF_{2q}O)-$, $-(CF(W))-$, $-(CF(W)O)-$, $-(CF(W)C_qF_{2q}O)-$, $-(C_qF_{2q}CF(W)O)-$, $-(CF_2CF(W)O)-$, or combinations thereof. In these repeating units, q is typically an integer of 1 to 10. In some embodiments, q is an integer of 1 to 8, 1 to 6, 1 to 4, or 1 to 3. The group W is a perfluoroalkyl group, perfluoroether group, perfluoropolyether, or a perfluoroalkoxy group, all of which can be linear, branched, or cyclic. The W group typically has no more than 12 carbon atoms, no more than 10 carbon atoms, no more than 9 carbon atoms, no more than 4 carbon atoms, no more than 3 carbon atoms, no more than 2 carbon atoms, or no more than 1 carbon atom. In some embodiments, the W group can have no more than 4, no more than 3, no more than 2, no more than 1, or no oxygen atoms. In these perfluoropolyether groups, the different repeat units can be distributed randomly along the chain.

For monovalent $R_f$ groups, terminal groups can be $(C_qF_{2q+1})$—, $(C_qF_{2q+1}O)$—, —$(VC_qF_{2q}O)$—, or —$(VC_qF_{2q+1})$— wherein q is as described in the previous paragraph and V is hydrogen, chlorine, or bromine. Exemplary monovalent $R_f$ groups include $CF_3O(C_2F_4O)_rCF_2$— and $C_3F_7O(CF(CF_3)CF_2O)_rCF(CF_3)$— wherein r has an average value of 0 to 50, 1 to 50, 3 to 30, 3 to 15, or 3 to 10.

Divalent $R_f$ groups include —$CF_2O(CF_2O)_r(C_2F_4O)_sCF_2$—, —$(CF_2)_3O(C_4F_8O)_s(CF_2)_3$—, —$CF_2O(C_2F_4O)_sCF_2$—, and —$CF(CF_3)(OCF_2CF(CF_3))_tOC_vF_{2v}O(CF(CF_3)CF_2O)_sCF(CF_3)$— wherein r is as described in the previous paragraph; s has an average value of 0 to 50, 3 to 30, 3 to 15, or 3 to 10; t has an average value of 0 to 50, 1 to 50, 3 to 30, 3 to 15, or 3 to 10; the sum (n+t) has an average value of 0 to 50 or 4 to 40; the sum (r+s) is greater than 0; and v is an integer of 2 to 6.

As synthesized, compounds typically include a mixture of $R_f$ groups. The average structure is the structure averaged over the mixture components. The values of r, s, and t in these average structures can vary, as long as the group has a number average molecular weight of at least about 300 or at least about 1000. Useful $R_f$ groups often have a molecular weight (number average) of 300 to 5000, 800 to 4000, or 1000 to 5000.

Q may comprise any of the divalent linking groups described above for $L_1$. Q may comprise a covalent bond, e.g., the fluorinated (meth)acrylate may comprise $R_f$—XC(O)C$(R^4)$=$CH_2$ such as $R_f$—OC(O)C$(R^4)$=$CH_2$.

Examples of suitable fluorinated (meth)acrylates include perfluoropolyether (meth)acrylates such as: $C_3F_7O(CF(CF_3)CF_2O)_aCF(CF_3)CH_2OC(O)CH$=$CH_2$, $C_3F_7O(CF(CF_3)CF_2O)_aCF(CF_3)CH_2OC(O)C(CH_3)$=$CH_2$, $C_3F_7O(CF(CF_3)CF_2O)_aCF(CF_3)CH_2OCH_2CH_2C(O)CH$=$CH_2$, $C_3F_7O(CF(CF_3)CF_2O)_aCF(CF_3)CH_2OCH_2CH_2OC(O)C(CH_3)$=$CH_2$, $C_3F_7O(CF(CF_3)CF_2O)_aCF(CF_3)C(O)NHCH_2CH_2OC(O)CH$=$CH_2$, and $C_3F_7O(CF(CF_3)CF_2O)_aCF(CF_3)C(O)NHCH_2CH_2OC(O)C(CH_3)$=$CH_2$, wherein a may be from 1 to 50.

The fluorinated (meth)acrylate may be represented by the formula:

wherein: $R_f$ comprises $C_3F_7O(C_3F_6O)_rCF(CF_3)$— with r being from 1 to 30, Q comprises a divalent linking group, and $R^4$ comprises H or $CH_3$.

The fluorinated (meth)acrylate may be used in any amount desired depending on the desired properties of the oligomer and/or the coating. For example, the perfluoropolyether (meth)acrylate may comprise from about 5 to about 60 wt. %, from about 5 to about 50 wt. %, or from about 10 to about 40 wt. %, relative to the total weight of the oligomer.

The epoxy(meth)acrylate may be represented by the formula:

wherein: G, $L_1$ and $R^4$ are as described above. For example, the epoxy(meth)acrylate may comprise glycidyl(meth)acrylate. Other particular epoxy(meth)acrylates are described in International Application No. PCT/US2009/036733 to Qiu et al.

The epoxy(meth)acrylate may be used in any amount desired depending on the desired properties of the oligomer and/or the coating. For example, the epoxy (meth)acrylate may comprise from about 5 to about 90 wt. %, or from about 10 to about 60 wt. %, relative to the total weight of the oligomer.

The silane(meth)acrylate may be represented by the formula:

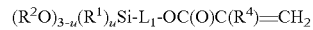

wherein $L_1$, $R^1$, $R^2$ and $R^4$ are as described above. Exemplary silane(meth)acrylates include acryloxypropyl trialkoxysilanes and methacryloxypropyl trialkoxysilanes. For example, the silane(meth)acrylate may comprise gamma-methacryloxypropyl trimethoxysilane. Ethylenically unsaturated silanes such as vinyl trialkoxy silanes may also be used.

The silane(meth)acrylate may be used in any amount desired depending on the desired properties of the oligomer and/or the coating. For example, the silane (meth)acrylate may comprise from about 5 to about 90 wt. %, or from about 10 to about 60 wt. %, relative to the total weight of the oligomer.

The coating may further comprise a multifunctional epoxide. Useful multifunctional epoxides include those having cycloaliphatic functionality. The multifunctional epoxide may be selected from the group consisting of: bis-(3,4-epoxycyclohexylmethyl)adipate; 1,4-cyclohexanedimethanol diglycidyl ether; and glycerol propoxylate triglycidyl ether. The multifunctional epoxide may comprise bis-(3,4-epoxycyclohexylmethyl)adipate and 1,4-cyclohexanedimethanol diglycidyl ether. Other multifunctional epoxides are described in Application No. PCT/US2009/036733 to Qiu et al.

The multifunctional epoxide may be used in any amount desired depending on the desired properties of the coating. For example, the multifunctional epoxide may comprise from about 0.05 to about 30 wt. % or from about 0.05 to about 20 wt. %, relative to the total weight of the coating. The multifunctional epoxide may also comprise from about 0.02 to about 15 wt. %, or from about 0.05 to about 10 wt. %, relative to the total weight of the coating.

The monomers may be used to prepare the oligomer wherein: the fluorinated (meth)acrylate comprises from about 5 to about 60 wt. %, the epoxy(meth)acrylate comprises from about 5 to about 90 wt. %, and the silane(meth)acrylate comprises from about 5 to about 90 wt. %, all relative to the total weight of the oligomer.

The oligomer may be used to prepare the coating wherein: the oligomer comprises from about 0.005 to about 20 wt. %, relative to the total weight of the coating. Useful coatings have: the epoxy silane comprising from about 50 to about 95 wt. %, and the oligomer comprising from about 0.005 to about 20 wt. %, both relative to the total weight of the coating. Useful coatings have: the epoxy silane comprising from about 50 to about 95 wt. %, the multifunctional epoxide comprising from about 0.05 to about 30 wt. %, and the oligomer comprising from about 0.005 to about 20 wt. %, all relative to the total weight of the coating.

The coating may further comprise a curable silane represented by the formula:

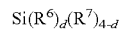

wherein: $R^6$ comprises an alkyl, aryl, arylalkylenyl or alkylarylenyl group, $R^7$ comprises a halide, hydroxyl, aryloxy, acyloxy or polyalkyleneoxy group, and d is 0, 1 or 2; and the curable silane comprises from about 0.005 to about 30 wt. % relative to the total weight of the coating.

The coating may further comprise tetraethyl orthosilicate (TEOS).

The coating may further comprise: a multifunctional epoxide, and a curable silane represented by the formula:

$$Si(R^6)_d(R^7)_{4-d}$$

wherein: $R^6$ comprises an alkyl, aryl, arylalkylenyl or alkylarylenyl group, $R^7$ comprises a halide, hydroxyl, aryloxy, acyloxy or polyalkyleneoxy group, and d is 0, 1 or 2.

The oligomer may comprise:

$$M^F M^E M^S$$

wherein $M^F$ comprises a fluorinated (meth)acrylate, $M^E$ comprises an epoxy (meth)acrylate, and $M^S$ comprises a silane (meth)acrylate.

A composition for forming the coating may comprise: an epoxy silane; and an oligomer comprising:

$$M^F M^E M^S$$

wherein $M^F$ comprises a fluorinated (meth)acrylate, $M^E$ comprises an epoxy (meth)acrylate, and $M^S$ comprises a silane (meth)acrylate.

The oligomer may comprise: an oxirane ring, a hydrolysable silane group, and a fluorinated group. A coating consisting essentially of the oligomer may be employed.

The oligomer comprises the reaction product of: a fluorinated (meth)acrylate, an epoxy(meth)acrylate, and a silane (meth)acrylate, or a perfluoropolyether (meth)acrylate, an epoxy(meth)acrylate, and a silane(meth)acrylate. The oligomer is generally prepared by free radical polymerization of these monomers in the presence of one or more chain transfer agents. Suitable chain transfer agents include, for example, hydroxy-, amino-, mercapto, silane and halogen substituted organic compounds such as tetrabromomethane and mercapto substituted derivatives of ethane, propane, butane, octane, dodecane, propanol, butanol, propanediol, ethylamine and the like. The chain transfer agent is typically present in an amount sufficient to control the number of polymerized monomer units and molecular weight of the oligomer, for example, in an amount of from about 0.005 equivalents to about 0.5 equivalents, per equivalent of monomer.

Additional (meth)acrylates without silane and epoxy functional groups may be used to prepare the oligomer. Additional (meth)acrylates may contain functional groups which are not reactive to silane and epoxy group. Representative (meth) acrylates are methyl acrylate, methyl methacrylate, ethyl acrylate, 2-bromoethyl acrylate, n-butyl acrylate, t-butyl acrylate, hexyl acrylate, n-octyl acrylate, n-octyl methacrylate, iso-octyl acrylate, octadecyl acrylate, methoxy polyethylene glycol monomethacrylate, tetrahydrofurfuryl acrylate, alkoxylated tetrahydrofurfuryl acrylate, lauryl acrylate, alkoxylated lauryl acrylate, 2-phenoxyethyl acrylate, menthyl acrylate, n-benxylacrylate, tridecyl acrylate, caprolactone acrylate, isobornyl acrylate, alkoxylated phenol acrylate, polypropylene glycol monoacrylate, acrylonitrile, 2-cyanoethyl acrylate, 1H,1H,2H,2H-perfluorobutyl acrylate, 1H,1H,2H,2H-perfluorohexyl acrylate, and methyl vinyl ketone.

The oligomer may be prepared using a polymerization initiator such as a VAZO product available from DuPont Co. Other suitable polymerization initiators include azo compounds such as azobisisobutyronitrile (AIBN), hydroperoxides, peroxides and the like.

Polymerization to form the oligomer may be carried out in any solvent suitable for organic free-radical reactions. The monomers can be present in the solvent at any suitable concentration including, for example, from about 5% by weight to about 90% by weight based on the total weight of the reaction mixture. Suitable solvents include, for example, aliphatic, alicyclic and aromatic hydrocarbons, ethers, esters, ketones, sulfoxides and the like. Solvents may be selected based on considerations such as the solubility of reagents, the temperature required for the use of a particular initiator, and desired molecular weight. Suitable temperatures for polymerization are from about 30 to about 200° C.

The coating may be prepared using a photoacid generator or cationic photoinitiator in conjunction with UV radiation. Useful cationic photoiniators include many types of aryl-substituted compounds in the form of salts, for example, aromatic onium salts such as salts of Groups Va, VIIa and VIIa elements. Cationic photoinitiators are available as CYRACURE products from Ciba Geigy Co., for example, CYRACURE UVI-6974. Other cationic photoinitiators are described in International Application No. PCT/US2009/036733 to Qiu et al. Cationic initiator is typically present in the compositions of the invention in a range from about 1% to about 5% by weight.

Preferably, the coating is formed from a solvent-free coating composition. In some embodiments, however, the compositions comprise solvent such as, for example, ketones (for example, acetone, methyl ethyl ketone (MEK) or methyl isobutyl ketone (MIBK)), esters (for example, ethyl acetate, methyl isobutyl ether, or propylene carbonate), or ethers (for example, methyl tert-butyl ether (MTBE) or tetrahydrofuran (THF)), or combinations.

The coating may further comprise a crosslinker to cure and crosslink both the epoxy and silane groups in epoxy-silane coating formulations. Crosslinker can be added for enhanced control over the hardness or coating quality. 1,4 cyclohexanedimethanol diglycidal ether (CDDE) is an example of a suitable crosslinker.

The coating may comprise curable silanes, titanates and zirconates. For example, silicates such as tetraalkyl orthosilicates may be used in an amount of up to about 40 wt. % relative to the total weight of the coating. Other curable additives include tetramethoxysilane, tetraethoxysilane, methyltriethoxysilane, dimethyldiethoxysilane, octadecyltriethoxysilane, methyltrichlorosilane, tetramethyl orthotitanate, tetraethyl orthotitanate, tetraisopropyl orthotitanate, tetraethylzirconate, tetraisopropylzirconate, and tetrapropylzirconate.

The coating may be used on any type of suitable substrate, for example, a substrate comprising natural stone, man-made stone, ceramic, vinyl, wood, masonry, cork, glass, plastic or the like. In some embodiments, the substrate may comprise an optically clear substrate which may have low haze (for example, less than about 5% or even less than about 2%) and high transparency (for example, greater than 95% or greater than 98%) for visible and ultraviolet light. Optically clear substrates may comprise glass, fused silica, polyethylene terephthalate (PET), polycarbonate, or poly(methyl)methacrylate.

The coating may be present on a substrate in an amount that does not substantially change the appearance, such as optical characteristics, of the underlying substrate. The thickness of the coating may be from about 0.5 to about 40 microns, from about 2 to about 15 microns or from about 2 to about 10 microns. In some cases, for example when the coating is a single layer sole coating, the thickness may be from about 1 to about 100 microns. If the coating comprises multiple layers disposed on top of one another, the topmost layer can be much thinner than the layer underneath. For example, the topmost layer may be from about 20 Angstroms to about 1 micron or from about 40 to about 100 nm. A useful total thickness for the coating (which includes all layers in a multiple layer coating)

can be any suitable thickness including, e.g., from about 0.5 to about 40 micron, or from about 1 to about 5 micron. If multiple layers are used, then they may have the same or different compositions.

The coating compositions can be applied to a substrate using any suitable method or technique including, e.g., spraying, brushing, wiping, knife coating, notch coating, reverse roll coating, gravure coating, soaking, dip coating, bar coating, flood coating, spin coating and combinations thereof, and in any suitable form including a continuous or discontinuous layer. The resulting coating can likewise be in a variety of forms including, e.g., a continuous or discontinuous layer (e.g., in a pattern, dots, stripes and swirls).

After or during coating, the coating composition is cured or at least partially cured using radiation such as UV radiation. If solvent is present, it may be at least partially removed (e.g., using a forced air oven, through evaporation at elevated and ambient temperatures, and combinations thereof), and the composition is then at least partially cured to form the coating.

The coatings disclosed herein may be used in making phototools. Useful phototools include those wherein the coating is disposed on an optically clear substrate. The optically clear substrate comprises an image such as a circuit pattern formed using a digital imaging system. An assembly is formed by disposing a photosensitive material or photoresist on a metal substrate, wherein the coating layer and the photosensitive material are adjacent each other. The photosensitive material may comprise a photographic emulsion layer comprising silver halide or azo emulsion. Chrome metal absorbing film may also be used. The metal substrate may comprise copper sheeting. The assembly is then exposed to radiation such that the photosensitive material is cured (developed and fixed) to form hardened portions that form an image of the phototool. At some point, the phototool and the photosensitive material after curing are separated. The negative image of the hardened photosensitive material is washed, dried, examined and optionally retouched.

Thus, a method of making a printed assembly such as a printed circuit board, is disclosed. The method comprises: providing the assembly described in the previous paragraph, and exposing the photoresist layer to radiation through the phototool, thereby hardening the photoresist layer in selected areas to form a negative image of the image provided by the optically clear substrate. The method may further comprise separating the phototool from the hardened photoresist layer.

EXAMPLES

Objects and advantages of this invention are further illustrated by the following examples, but the particular materials and amounts thereof recited in these examples, as well as other conditions and details, should not be construed to unduly limit this invention.

Materials

Materials utilized in the examples are shown in Table 1.

TABLE 1

| Material | Supplier |
|---|---|
| Water | Millipore Corporation, Billerica, MA |
| Acetone | EMD Chemicals Inc., Gibbstown, NJ |
| Hexadecane | Sigma-Aldrich, St. Louis, MO |
| IPA, Isopropylalchohol | VWR International, West Chest, PA |
| Toluene | EMD Chemicals Inc., Gibbstown, NJ |
| EtOAc, Ethyl acetate | J.T. Baker, Phillipsburg, NC |
| MEK, Methyl ethyl ketone | EMD Chemicals Inc., Gibbstown, NJ |
| DMF, N,N-dimethylformamide | Sigma-Aldrich, St. Louis, MO |
| A-186, β-(3,4-epoxycyclohexyl)ethyltrimethoxysilane) | GE Advanced Materials, Albany, NY |
| A-187, γ-Glycidoxypropyltrimethoxysilane | GE Advanced Materials, Albany, NY |
| A-174, $CH_2$=$CMeC(O)O(CH_2)_3Si(OMe)_3$ | GE Advanced Materials, Albany, NY |
| HFPO-MAr, $F(CF(CF_3)CF_2O)xCF(CF_3)C(O)NHCH_2CH_2OCO$-$CMe$=$CH_2$ | 3M Company, St. Paul, MN See U.S. Pat. No. 7,094,829 |
| GMA, Glycidyl methacrylate | Sigma-Aldrich, St. Louis, MO |
| PI, photo-initiator, Cyracure ™ UVI-6976, triarylsulphonium hexafluoroantimonate, 50% in propylene carbonate | Dow Chemical Company, Midland, MI |
| Vazo ® 67, 2,2'-Azobis(2-methylbutyronitrile) | DuPont, Wilmington, DE |
| TEOS, Tetraethyl orthosilicate | Sigma-Aldrich, St. Louis, MO |
| CDDE, 1,4-Cyclohexanedimethanol diglycidyl ether | Sigma-Aldrich, St. Louis, MO |
| ERL-4299, Bis-(3,4-epoxycyclohexylmethyl) adipate | Dow Chemical Company, Midland, MI |
| GPTE, Glycerol propoxylate triglycidyl ether | Sigma-Aldrich, St. Louis, MO |
| $CBr_4$, Tetrabromomethane | Sigma-Aldrich, St. Louis, MO |

Test Methods

Contact Angle Measurement

The coated films were rinsed for 1 minute with hand agitation in an IPA bath and dried prior to the water and hexadecane contact angles measurements. Measurements were made using a VCA-2500XE video contact angle analyzer available from AST Products (Billerica, Mass.). Reported values are the average of at least 2 drops, while each drop was measured twice. Drop volumes were 5 μL, for static measurements and 1-3 μL, for advancing and receding.

Marker Repellent Test

A Sharpie® King Size Permanent Marker, Sharpie® Permanent Marker, and Vis-á-vis® Permanent Overhead Project Pen (all from Sanford, Oak Brook, Ill.) were used to mark on the cured coating. The ink was visually assessed and scored from 5 (complete ink bead-up) to 1 (no ink bead-up).

Steel Wool Durability Test

The abrasion resistance of the cured films was tested crossweb to the coating direction by use of a mechanical device capable of oscillating steel wool fastened to a stylus across the film's surface. The stylus oscillated over a 10 cm wide sweep at a rate of 3.5 wipes/second. A wipe is defined as a single travel of 10 cm. The stylus had a flat, cylindrical geometry with a diameter of 3.8 mm having a 400 g load. The steel wool was obtained from Rhodes-American a division of Homax Products, Bellingham, Wash. under the trade designation "#0000-Super-Fine" and was used as received. Each composition was tested once, with each test consisting of 50 wipes with the 400 g load. After this test, the Marker Repellent Test, utilizing the Sharpie® Permanent Marker, and the water and hexadecane contact angle were measured on the abraded surface.

Solvent Resistant Test

One drop (approximately 1.25 cm diameter) of an organic solvent was placed on the cured coatings. The solvent was allowed to evaporate to dryness at room temperature and the coating was visually rated. A "clear" rating indicates a clear surface without observable damage to the coating, while "hazy" indicates a hazy surface. In addition, the Marker Repellent Test was used with the Sharpie® Permanent Marker to test the dried solvent spot.

Tissue Wipe Test

Sight Savers pre-moisture (with IPA) lens cleaning tissue made by Bausch & Lomb were used to wipe the cured surface 20 times. After wiping and drying the surface, the Marker Repellent Test was used with the Sharpie® Permanent Marker to test the wiped area. The wiped surface was also visually inspected and rated as clear or hazy.

Coating Quality

Coating quality was visually assessed and rated as Excellent, Good, Okla., or Some Dewetting.

Preparation of Oligomers (FAO)

FAO-1, HFPO-MAr/GMA/A-174 (30/10/60 by Weight)

To a 4 Oz bottle, 3.0 g of HFPO-MAr, 1.0 g GMA, 6.0 g A-174, 0.045 g $CBr_4$, 30 g EtOAc, and 0.25 g Vazo-67 were added. After nitrogen was bubbled into this mixture for 1 minute, the bottle was sealed, and the mixture was heated to 70° C. for 24 hours with magnetic stirring. A clear, homogeneous solution was obtained. FTIR analysis indicated nearly all $CH_2$=CMe- had reacted. The final solution contained approximately 25% solids.

FAO-2, HFPO-MAr/GMA/A-174 (30/20/50 by Weight)

FAO-2 was prepared in a similar fashion to FAO-1 with the following components: 3.0 g of HFPO-MAr, 2.0 g GMA, 5.0 g A-174, 0.021 g $CBr_4$, 30 g EtOAc, and 0.21 g Vazo-67.

FAO-3, HFPO-MAr/GMA/A-174 (30/30/40 by Weight)

FAO-3 was prepared in a similar fashion to FAO-1 with the following components: 3.0 g of HFPO-MAr, 3.0 g GMA, 4.0 g A-174, 0.025 g $CBr_4$, 30 g EtOAc, and 0.20 g Vazo-67.

FAO-4, HFPO-MAr/GMA/A-174 (30/40/30 by Weight)

FAO-4 was prepared in a similar fashion to FAO-1 with the following components: 3.0 g of HFPO-MAr, 4.0 g GMA, 3.0 g A-174, 0.035 g $CBr_4$, 30 g EtOAc, and 0.22 g Vazo-67.

FAO-5, HFPO-MAr/GMA/A-174 (30/50/20 by Weight)

FAO-5 was prepared in a similar fashion to FAO-1 with the following components: 3.0 g of HFPO-MAr, 5.0 g GMA, 2.0 g A-174, 0.033 g $CBr_4$, 30 g EtOAc, and 0.20 g Vazo-67.

FAO-6, HFPO-MAr/GMA/A-174 (30/60/10 by Weight)

FAO-6 was prepared in a similar fashion to FAO-1 with the following components: 3.0 g of HFPO-MAr, 6.0 g GMA, 1.0 g A-174, 0.035 g $CBr_4$, 30 g EtOAc, and 0.22 g Vazo-67.

FAO-7, HFPO-MAr/GMA/A-174 (40/10/50 by Weight)

FAO-7 was prepared in a similar fashion to FAO-1 with the following components: 4.0 g of HFPO-MAr, 1.0 g GMA, 5.0 g A-174, 0.068 g $CBr_4$, 30 g EtOAc, and 0.19 g Vazo-67.

Preparation of Epoxy-Silanes

Representative epoxy-silane (ES) coating formulations were prepared by mixing the components in the following weight ratios.

ES-1: A-187/ERL-4299/PI, 89/2/9
ES-2: A-186/GPTE/PI, 86/5/9
ES-3: FX-1000, available from 3M Company Preparation of Coating Formulations Each formulation was prepared by combining and mixing the individual components. All formulations were coated on primed polyester (Melinex 618, DuPont, Wilmington, Del.) with a No#6 wire rod, dried for 2 minutes at 120° C., and cured with one of the UV sources listed below. The formulations were generally clear, indicating good compatibility of the perfluoropolyether urethane silane additives with the epoxy-silane coating formulations.

UV-1: H-Bulb under $N_2$, two pass at 20 feet per minute
UV-2: Two Sylvania Germicidal G15T8 bulbs (15W) in air for 2 minutes
UV-3: Two Black Light Blue UV bulbs (F15T8BLB15W) in air for 2 minutes Representative example formulations and performance data are summarized in following tables. All formulations are based on weight %.

Results

Test results for coatings consisting essentially of oligomers and photoinitiator are summarized in Table 2.

TABLE 2

| Formulation Number | Formulation Composition [a] | Marker Repellent [b] | Water Adv/Rec/Static | | | Hexadecane Adv/Rec/Static | | | Coating Quality |
|---|---|---|---|---|---|---|---|---|---|
| E-1 | FAO-1/PI 90/10 | 5/5/5 | 117 | 95 | 112 | 73 | 66 | 71 | Excellent |
| E-2 | FAO-2/PI 90/10 | 5/5/5 | 117 | 98 | 112 | 73 | 66 | 70 | Excellent |
| E-3 | FAO-4/PI 90/10 | 5/5/5 | 117 | 94 | 112 | 74 | 68 | 72 | Good |
| E-4 | FAO-7/PI 90/10 | 5/5/5 | 116 | 103 | 112 | 73 | 67 | 70 | Excellent |

[a] All formulations cured with UV-2

[b] Order tested: King/Permanent/Vis-à-vis ®

Test results for coatings consisting essentially of epoxy-silanes and oligomers are summarized in Table 3.

TABLE 3

| Form. No. | Formulation Composition | Marker Repel [a] | Water Adv/Rec/Static | | | Hexadecane Adv/Rec/Static | | | Coating Quality |
|---|---|---|---|---|---|---|---|---|---|
| E-5  | FAO-1/ES-1 2/98 [b] | 3/5/5 | 113 | 83  | 108 | 72 | 62 | 69 | Good |
| E-6  | FAO-2/ES-1 2/98 [b] | 4/5/5 | 112 | 83  | 108 | 73 | 62 | 70 | Good |
| E-7  | FAO-2/ES-1 2/98 [c] | 5/5/5 | 115 | 88  | 111 | 72 | 64 | 69 | Excellent |
| E-8  | FAO-2/ES-1 2/98 [d] | 5/5/5 | 115 | 90  | 110 | 71 | 63 | 69 | Excellent |
| E-9  | FAO-3/ES-1 2/98 [b] | 5/5/5 | 114 | 77  | 107 | 75 | 61 | 71 | Excellent |
| E-10 | FAO-3/ES-2 2/98 [b] | 5/5/5 | 108 | 76  | 104 | 71 | 57 | 69 | Good |
| E-11 | FAO-3/ES-1 5/95 [b] | 5/5/5 | 110 | 80  | 108 | 72 | 60 | 69 | Excellent |
| E-12 | FAO-4/ES-1 2/98 [b] | 5/5/5 | 111 | 82  | 108 | 71 | 59 | 69 | Good |
| E-13 | FAO-4/ES-2 2/98 [b] | 5/5/5 | 108 | 76  | 105 | 71 | 58 | 70 | Good |
| E-14 | FAO-4/ES-1 5/95 [b] | 5/5/5 | 112 | 79  | 108 | 72 | 61 | 69 | Good |
| E-15 | FAO-5/ES-1 2/98 [b] | 5/5/5 | 110 | 73  | 108 | 71 | 58 | 69 | Good |
| E-16 | FAO-5/ES-1 5/95 [b] | 5/5/5 | 113 | 79  | 109 | 70 | 63 | 69 | Good |
| E-17 | FAO-5/ES-1 5/95 [c] | 5/5/5 | 113 | 79  | 108 | 70 | 58 | 68 | Excellent |
| E-18 | FAO-6/ES-1 2/98 [b] | 5/5/5 | 113 | 73  | 108 | 71 | 60 | 68 | Good |
| E-19 | FAO-6/ES-1 2/98 [c] | 5/5/5 | 114 | 79  | 109 | 72 | 62 | 69 | Excellent |
| E-20 | FAO-6/ES-1 5/95 [b] | 5/5/5 | 112 | 74  | 107 | 72 | 62 | 71 | Good |
| E-21 | FAO-7/ES-1 2/98 [b] | 5/5/5 | 114 | 82  | 107 | 71 | 62 | 69 | Excellent |
| E-22 | FAO-7/ES-3 2/98 [b] | 5/5/5 | 117 | 95  | 111 | 73 | 68 | 70 | Excellent |
| E-23 | FAO-7/ES-3 5/95 [b] | 5/5/5 | 119 | 100 | 112 | 73 | 68 | 71 | Excellent |
| C-1  | ES-1 100 [b]        | 1/1/1 | 86  | 38  | 84  | 21 | 12 | 19 | Excellent |
| C-2  | ES-2 100 [b]        | 1/1/1 | 78  | 45  | 68  | 12 | 5  | 11 | Good |
| C-3  | ES-3 100 [b]        | 4/3/3 | 91  | 55  | 91  | 32 | 27 | 33 | Good |
| C-4  | Release [e]         | 2/3/3 | 94  | 61  | 92  | 34 | 19 | 34 | N/A |

[a] Order tested: King/Permanent/Vis-à-vis ®
[b] Formulation cured with UV-2;
[c] with UV-3;
[d] with UV-1
[e] Silicone-based release liner available from Sekisui Chemical, Japan As shown in Table 3, the addition of 2-5% perfluoropolyether acrylate to epoxy-silane formulations significantly improved the marker repellency and the contact angles when compared to the comparative formulations C-1 to C-4. In many examples, the repellent performance is similar to that of pure epoxy-silane perfluoropolyether acrylate oligomer coating shown in Table 2.

Test results for representative formulations with crosslinker are shown in Table 4.

TABLE 4

| Form. No. | Formulation Composition [a] | Marker Repel [b] | Water Adv/Rec/Static | | | Hexadecane Adv/Rec/Static | | | Coating Quality |
|---|---|---|---|---|---|---|---|---|---|
| E-24 | FAO-1/ES/CDDE 2/93/5    | 5/5/5 | 112 | 77 | 109 | 71 | 60 | 69 | Good |
| E-25 | FAO-1/ES-1/CDDE 2/88/10 | 5/5/5 | 111 | 78 | 108 | 70 | 61 | 68 | Good |
| E-26 | FAO-1/ES-1/TEOS 2/93/5  | 5/5/5 | 118 | 93 | 106 | 72 | 64 | 69 | Good |
| E-27 | FAO-1/ES-1/TEOS 2/88/10 | 5/5/5 | 115 | 92 | 110 | 72 | 63 | 70 | Haze |
| E-28 | FAO-2/ES-1/CDDE 2/88/10 | 5/5/5 | 110 | 76 | 109 | 73 | 61 | 70 | Good |
| E-29 | FAO-2/ES-1/CDDE 2/88/10 | 4/5/5 | 111 | 72 | 108 | 72 | 60 | 70 | Good |
| E-30 | FAO-2/ES-1/TEOS 2/93/5  | 5/5/5 | 115 | 87 | 106 | 71 | 61 | 69 | Excellent |
| E-31 | FAO-2/ES-1/TEOS 2/88/10 | 5/5/5 | 114 | 95 | 111 | 71 | 64 | 68 | Haze |
| E-32 | FAO-4/ES-1/CDDE 2/93/5  | 5/5/5 | 113 | 72 | 109 | 72 | 61 | 69 | Good |
| E-33 | FAO-4/ES-1/CDDE 2/88/10 | 5/5/5 | 112 | 77 | 108 | 75 | 64 | 71 | Good |
| E-34 | FAO-4/ES-1/TEOS 2/93/5  | 5/5/5 | 114 | 81 | 110 | 71 | 62 | 69 | Good |
| E-35 | FAO-4/ES-1/TEOS 2/88/10 | 5/5/5 | 116 | 87 | 111 | 70 | 62 | 68 | Haze |
| E-36 | FAO-7/ES-1/CDDE 2/93/5  | 5/5/5 | 115 | 99 | 111 | 72 | 67 | 71 | Good |
| E-37 | FAO-7/ES-1/CDDE 2/88/10 | 5/5/5 | 116 | 97 | 110 | 72 | 67 | 70 | Good |

TABLE 4-continued

| Form. No. | Formulation Composition [a] | Marker Repel [b] | Water Adv/Rec/Static | | | Hexadecane Adv/Rec/Static | | | Coating Quality |
|---|---|---|---|---|---|---|---|---|---|
| E-38 | FAO-7/ES-1/TEOS 2/93/5 | 5/5/5 | 117 | 95 | 111 | 73 | 68 | 70 | Excellent |
| E-39 | FAO-7/ES-1/TEOS 2/88/10 | 5/5/5 | 119 | 103 | 114 | 72 | 68 | 71 | Haze |

[a] All formulations cured with UV-2
[b] Order tested: King/Permanent/Vis-à-vis ®

As shown in Table 4, no significant effect on performance was observed with the addition of the TEOS or CDDE crosslinker.

As a protective coating, it is important for the coating to be resistant to solvents that may be present in cleaning solutions. As a release liner, it is important that the liner be resistant to solvents that may be present in adhesives. Several experimental formulations (E-1 through E-10, E-12, E-13, E-15, E-18, E-21, E-22, E-24, E-26, E-28, E-30, E-32, E-34, E-36, E-38) were tested for their compatibility with the following solvents: EtOAc, IPA, Acetone, Toluene, MEK, DMF. For all solvents tested, the film was rated as "clear" after solvent evaporation, and the Sharpie® Permanent Marker repellency was rated a 5.

In addition to solvent resistance, coatings must offer abrasion resistant protection. The Steel Wool Durability Test was performed on representative coated films, and the results are shown in Table 5.

TABLE 5

| Formulation Number | Visible Scratches | Marker Repellent [a] | Water Adv/Rec/Static | | | Hexadecane Adv/Rec/Static | | |
|---|---|---|---|---|---|---|---|---|
| 5 | No | 5/5/5 | 111 | 87 | 107 | 67 | 58 | 66 |
| 6 | No | 5/5/5 | 115 | 81 | 110 | 68 | 56 | 66 |
| 21 | No | 5/5/5 | 116 | 93 | 110 | 72 | 60 | 66 |
| 26 | No | 5/5/5 | 116 | 95 | 111 | 70 | 60 | 68 |
| 31 | No | 5/5/5 | 113 | 89 | 109 | 68 | 59 | 67 |
| 36 | No | 5/5/5 | 118 | 95 | 111 | 71 | 65 | 69 |
| 37 | No | 5/5/5 | 116 | 93 | 111 | 72 | 63 | 69 |
| 38 | No | 5/5/5 | 117 | 99 | 111 | 71 | 65 | 70 |
| 39 | No | 5/5/5 | 116 | 97 | 111 | 71 | 63 | |
| C-4 | Yes[b] | 2/3/3 | Not Measured | | | | | |

[a] Order tested: King/Permanent/Vis-à-vis ®
[b] Scratches visible after 4 wipes with 200 g weight As shown in Table 5, all example formulations showed good scratch resistance. In addition, the abraded area maintained marker repellency and high contact angles. In contrast, the uncoated release liner showed no steel wool scratch resistance and poor marker repellency.

Tape release was also studied. Samples were prepared by laminating a test tape, 845 (Scotch® 845 book tape, available from 3M Company) or 610 (Scotch® 610 premium cellophane tape, available from 3M Company) to the inventive coating cured on a PET film on a steel panel. The tape was applied to the coating using a 2.3 kg rubber roller. The tape was then peeled from the coating at an angle of 180° and a rate of 2.3 m/min. All tests were performed at constant temperature (70° F.) and constant humidity (50% RH). An IMass model SP2000 peel tester obtained from IMASS, Inc., Accord, Mass. was used for the measurements. Table 6 summarizes representative peel release results with a coating of FAO-7 in ES-1 and ES-3.

TABLE 6

| Formulation Number | Formulation Composition | Test Tape | Peel Force (g/in) |
|---|---|---|---|
| C-5 | ES-1/FAO-7 100/0 | 845 | 2340 |
| E-40 | ES-1/FAO-7 99.5/0.5 | 845 | 460 |
| E-41 | ES-1/FAO-7 98/2 | 845 | 380 |
| E-42 | ES-1/FAO-7 95/5 | 845 | 405 |
| C-6 | ES-3/FAO-7 100/0 | 845 | 535 |
| E-43 | ES-3/FAO-7 98/2 | 845 | 380 |
| C-7 | ES-1/FAO-7 100/0 | 610 | 1460 |
| E-44 | ES-1/FAO-7 99.5/0.5 | 610 | 920 |
| E-45 | ES-1/FAO-7 98/2 | 610 | 370 |
| E-46 | ES-1/FAO-7 95/5 | 610 | 330 |
| C-8 | ES-3/FAO-7 100/0 | 610 | 420 |
| E-47 | ES-3/FAO-7 98/2 | 610 | 400 |

As shown in Table 6, the peel force was significantly reduced with 2% or more epoxy-silane HFPO acrylate oligomer added to ES-1 or ES-3, in comparison with those coatings without the fluorinated additive.

The complete disclosures of the publications cited herein are incorporated by reference in their entirety as if each were individually incorporated. Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

What is claimed is:
1. An oligomer comprising:
an oxirane ring,
a hydrolysable silane group, and
a perfluoropolyether group.
2. An oligomer comprising the reaction product of:
a perfluoropolyether (meth)acrylate,
an epoxy (meth)acrylate, and
a silane (meth)acrylate.
3. A composition comprising the reaction product of:
(a) an epoxy silane; and
(b) an oligomer comprising:
a fluorinated (meth)acrylate,
an epoxy (meth)acrylate, and
a silane (meth)acrylate.

4. The composition of claim 3, wherein the epoxy silane is gamma-glycidoxypropyl trimethoxysilane or beta-(3,4-epoxycyclohexyl)ethyl trimethoxysilane.

5. The composition of claim 3, wherein the fluorinated (meth)acrylate is represented by the formula:

$$R_f\text{-Q-OC(O)C}(R^4)=CH_2$$

wherein:
$R_f$ comprises $C_3F_7O(C_3F_6O)_rCF(CF_3)$— with r being from 1 to 30;
Q comprises a divalent linking group; and
$R^4$ comprises H or $CH_3$.

6. The composition of claim 3, wherein the epoxy (meth)acrylate comprises glycidyl (meth)acrylate.

7. The composition of claim 3, wherein the oligomer comprises from about 0.005 to about 20 wt. %, relative to the total weight of the composition.

8. The composition of claim 7, wherein the epoxy silane comprises from about 50 to about 95 wt. %, relative to the total weight of the composition.

9. The composition of claim 8, wherein the multifunctional epoxide comprises from about 0.05 to about 30 wt. %, relative to the total weight of the composition.

10. The composition of claim 3, further comprising a multifunctional epoxide.

11. The composition of claim 10, wherein the multifunctional epoxide is bis-(3,4-epoxycyclohexylmethyl) adipate, 1,4-cyclohexanedimethanol diglycidyl ether, or glycerol propoxylate triglycidyl ether.

12. The composition of claim 3, further comprising a curable silane represented by the formula:

$$Si(R^6)_d(R^7)_{4-d}$$

wherein:
$R^6$ comprises an alkyl, aryl, arylalkylenyl or alkylarylenyl group;
$R^7$ comprises a halide, hydroxyl, aryloxy, acyloxy or polyalkyleneoxy group; and
d is 0, 1 or 2.

13. The composition of claim 3, further comprising tetraethyl orthosilicate.

14. The composition of claim 3, further comprising:
(c) a multifunctional epoxide;
(d) a curable silane represented by the formula $$Si(R^6)_d(R^7)_{4-d}$$

wherein:
$R^6$ comprises an alkyl, aryl, arylalkylenyl or alkylarylenyl group;
$R^7$ comprises a halide, hydroxyl, aryloxy, acyloxy or polyalkyleneoxy group; and
d is 0, 1 or 2; and
(e) tetraethyl orthosilicate.

15. An article comprising a coating disposed on a substrate, the coating having a thickness of from about 0.5 to about 40 um and comprising the composition claim 3.

16. An assembly comprising:
a phototool comprising an optically clear substrate that provides an image;
a metal substrate; and
a coating disposed between the phototool and the metal substrate, wherein the coating layer comprises the composition of claim 3.

17. An article comprising a layer of an image, the layer comprising the composition of claim 3.

18. A composition comprising:
(a) an epoxy silane; and
(b) an oligomer comprising:
a fluorinated (meth)acrylate ;
an epoxy (meth)acrylate, and
a silane (meth)acrylate.

19. The composition of claim 18 further comprising a photoacid generator.

* * * * *